(12) United States Patent
Jung

(10) Patent No.: US 11,367,857 B2
(45) Date of Patent: Jun. 21, 2022

(54) DISPLAY DEVICE HAVING COVER WINDOW

(71) Applicant: LG Display Co., Ltd., Seoul (KR)

(72) Inventor: Jae-Ho Jung, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/907,233

(22) Filed: Jun. 20, 2020

(65) Prior Publication Data

US 2020/0403181 A1 Dec. 24, 2020

(30) Foreign Application Priority Data

Jun. 21, 2019 (KR) ........................ 10-2019-0074066

(51) Int. Cl.
| | | |
|---|---|---|
| *H01L 51/52* | (2006.01) | |
| *H01L 27/32* | (2006.01) | |
| *H01L 27/14* | (2006.01) | |
| *G02F 1/13* | (2006.01) | |
| *H01L 27/146* | (2006.01) | |

(52) U.S. Cl.
CPC ........ *H01L 51/5253* (2013.01); *H01L 27/323* (2013.01); *H01L 27/3244* (2013.01); *H01L 51/524* (2013.01); *H01L 51/5281* (2013.01); *H01L 27/14678* (2013.01); *H01L 51/5246* (2013.01); *H01L 51/5284* (2013.01); *H01L 51/5293* (2013.01)

(58) Field of Classification Search
CPC ............... H01L 51/5253; H01L 51/524; H01L 51/5281; H01L 51/5293; H01L 51/5246; H01L 51/5284; H01L 51/5237; H01L 27/323; H01L 27/3244; H01L 27/14678; H01L 27/3272; G02F 1/133512; G02F 1/133528; G02F 1/1323; G02F 1/133308; G02F 1/1335; G02F 1/133331
See application file for complete search history.

(56) References Cited

U.S. PATENT DOCUMENTS

| | | | | |
|---|---|---|---|---|
| 8,952,599 | B2 * | 2/2015 | Jung | .................... H01L 51/5281 |
| | | | | 313/112 |
| 9,865,844 | B1 * | 1/2018 | Park | ..................... H01L 51/5284 |
| 10,048,792 | B1 * | 8/2018 | Schediwy | ............. G06F 3/0418 |
| 10,164,214 | B2 * | 12/2018 | Song | ........................ H01L 51/56 |
| 10,241,602 | B2 * | 3/2019 | Huo | ....................... G06F 3/04164 |
| 10,564,479 | B2 * | 2/2020 | Nishiwaki | ......... G02F 1/133528 |
| 10,712,607 | B2 * | 7/2020 | Lee | ........................... G02B 5/30 |
| 10,792,901 | B2 * | 10/2020 | Isojima | .................... B32B 27/34 |
| 10,935,700 | B2 * | 3/2021 | Hashimoto | ............... G09F 9/00 |
| 2008/0220184 | A1 * | 9/2008 | Sakurai | ............. G02F 1/133308 |
| | | | | 428/1.51 |
| 2011/0255034 | A1 * | 10/2011 | Nakano | ................. G02F 1/1333 |
| | | | | 349/84 |

(Continued)

FOREIGN PATENT DOCUMENTS

| | | |
|---|---|---|
| KR | 10-2018-0063180 A | 6/2018 |
| KR | 10-2018-0083171 A | 7/2018 |
| KR | 10-2018-0115655 A | 10/2018 |

*Primary Examiner* — Ida M Soward
(74) *Attorney, Agent, or Firm* — Polsinelli PC

(57) ABSTRACT

A display device includes a display panel; a polarizing film disposed on the display panel; a touch film disposed on the polarizing film; a light control film disposed on the touch film; a barrier film disposed over the polarizing film; and a cover window disposed on the barrier film.

10 Claims, 4 Drawing Sheets

(56) References Cited

U.S. PATENT DOCUMENTS

| | | | | |
|---|---|---|---|---|
| 2012/0127578 A1* | 5/2012 | Bright | .................... | G02B 1/116 |
| | | | | 359/585 |
| 2013/0335649 A1* | 12/2013 | Mather | .................. | H04N 13/31 |
| | | | | 359/315 |
| 2014/0071550 A1* | 3/2014 | Lee | ........................ | G02B 5/286 |
| | | | | 359/839 |
| 2016/0092005 A1* | 3/2016 | Toyoshima | ............. | B32B 27/36 |
| | | | | 345/174 |
| 2016/0102229 A1* | 4/2016 | Takarada | ............... | C09J 133/08 |
| | | | | 156/250 |
| 2016/0282661 A1* | 9/2016 | Nam | .................. | G02F 1/133308 |
| 2018/0224983 A1* | 8/2018 | Zhang | .................. | G06F 3/0412 |
| 2018/0299603 A1* | 10/2018 | Lee | ..................... | H01L 51/0097 |
| 2019/0115411 A1* | 4/2019 | Park | ....................... | H01L 27/323 |
| 2019/0348630 A1* | 11/2019 | Jung | ................... | H01L 51/5246 |
| 2020/0150487 A1* | 5/2020 | Zhou | ................. | G02F 1/133514 |
| 2020/0403186 A1* | 12/2020 | Choi | ................... | H01L 51/5281 |

* cited by examiner

DISPLAY DEVICE HAVING COVER WINDOW

CROSS-REFERENCE TO RELATED APPLICATION

This application claims the benefit of Korean Patent Application No. 10-2019-0074066, filed on Jun. 21, 2019, which is hereby incorporated by reference in its entirety.

BACKGROUND

Field of the Disclosure

The present disclosure relates to a display device, and more particularly, to a display device having a cover window coupled to an upper portion of a display panel formed of plastic so as to be coupled to the display panel by an adhesive layer.

Description of the Background

Image displays, which display various pieces of information through a screen, are core technology of the information and communication age, and are being developed towards thinness, light weight and high performance. Accordingly, as flat panel displays which have reduced weight and volume and thus overcome the drawbacks of cathode ray tubes (CRTs), a liquid crystal display which implements an image by receiving light from a light source, an electroluminescent display which emits light intrinsically without any light source unit, etc. are being spotlighted.

In these displays, a plurality of pixels is arranged in a matrix, thus displaying an image. Here, each pixel includes a light emitting diode, and a pixel driving circuit including a plurality of transistors configured to independently drive the light emitting diode.

Recently, research on thin and light display panels is actively being conducted, and display devices in which display panels may be bent into a curved surface or be folded and unfolded are being supplied. Further, in order to reduce weight, a cover window formed of plastic, as a substitute for a cover glass, is being applied to the upper portion of a display panel.

In the related art, in order to form the completed display device, a process of adhering the cover window to the display panel through an adhesive layer as well as a test process are needed. However, if the cover window formed of plastic is heated to a high temperature during a test process, and, in this case, bubbles are generated between the display panel and the cover window due to gas generated from the cover window. These bubbles can also affect the display panel as they may pass through the adhesive layer.

SUMMARY

Accordingly, the present disclosure is directed to a display device that substantially obviates one or more problems due to limitations and disadvantages of the related art.

The present disclosure is to provide a display device which prevents exhaust of gas towards a rear surface of a cover window formed of plastic by adhering a barrier film to the rear surface of the cover window, which is formed at a high temperature.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes a cover window, a display panel arranged on a rear surface of the cover window, and a barrier film arranged between the display panel and the cover window.

The display device may further comprise an optical film arranged between the barrier film and the display panel.

The optical film may include a light control film configured to adjust an angle of light emitted from the display panel towards the cover window.

The barrier film may include a first coating layer arranged on the rear surface of the cover window, a bonding layer configured to adhere the first coating layer to the cover window, a black masking layer arranged on a rear surface of the first coating layer, and a second coating layer arranged on a rear surface of the black masking layer.

The black masking layer may have a black masking part corresponding to a non-display area of the display panel.

A first area of the black masking layer, having the black masking part located therein, and a second area of the black masking layer, excluding the first area, may have an equal thickness.

The first coating layer and the second coating layer may include polyethylene terephthalate (PET).

The cover widow may include at least one of polycarbonate (PC) and polymethyl methacrylate (PMMA).

The barrier film may be adhered to the cover window using an in-molding method when the cover window is formed.

The display device may further comprise a first adhesive layer, wherein the first adhesive layer is adhered to a rear surface of the barrier film and the light control film is adhered to a rear surface of the first adhesive layer.

The display device may further include a second adhesive layer, a touch film and a third adhesive layer, wherein the second adhesive layer is arranged on a rear surface of the light control film, a touch film is arranged on a rear surface of the second adhesive layer, and a third adhesive layer is arranged on a rear surface of the touch film.

The optical film may further include a polarizing film interposed between the third adhesive layer and the display panel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
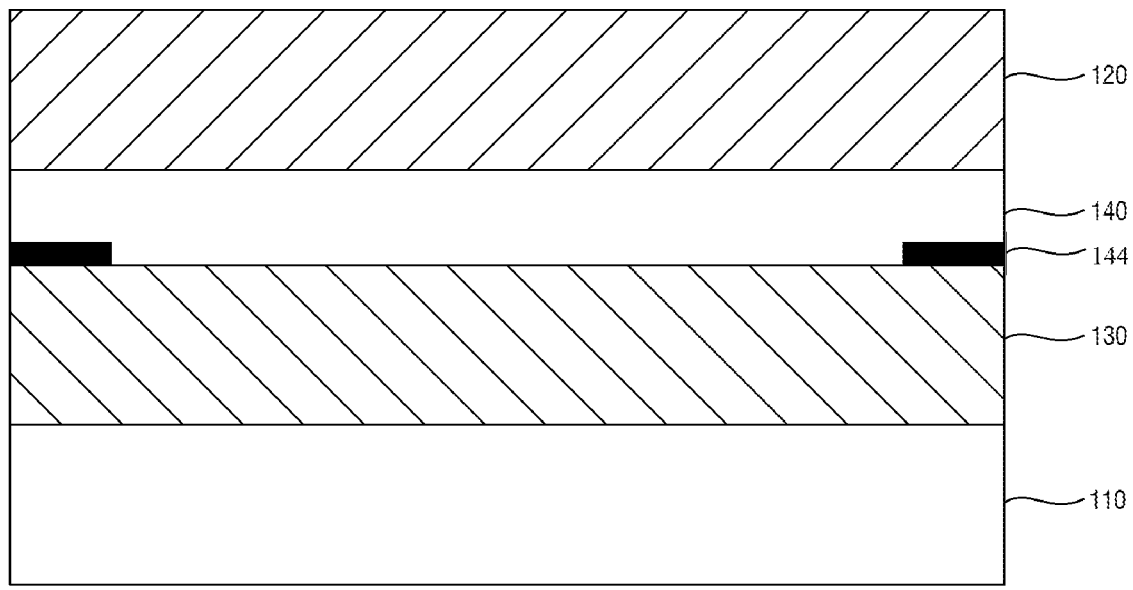
FIG. 1 is a cross-sectional view illustrating a display device according to one aspect of the present disclosure.

Reference will now be made in detail to the aspects of the present disclosure, examples of which are illustrated in the accompanying drawings. In the drawings, the same or similar elements are denoted by the same reference numerals even though they are depicted in different drawings. In the following description of the present disclosure, a detailed description of known functions and configurations incorporated herein will be omitted when it may make the subject matter of the present disclosure rather unclear. In addition, those skilled in the art will appreciate that some features shown in the drawings can be exaggerated, reduced or simplified for ease in illustration, and the drawings and elements shown in the drawings are not necessarily illustrated at an appropriate scale.

In the present disclosure, "display devices" may include, in a narrow sense, display devices, each of which includes a display panel and a driving unit to drive the display panel, such as a liquid crystal module (LCM), an organic light emitting diode (OLED) display module, an inorganic light emitting diode (LED) display module and a quantum-dot light emitting diode (QLED) display module. Further, "display devices" may include complete products (i.e., finished products) including an LCM, an OLED display module, an LED display module, a QLED display module, etc., such as a notebook computer, a TV, a computer monitor and an automotive display, other equipment display devices for vehicles, and set electronic devices or set devices (i.e., set apparatuses), such as a mobile electronic device, i.e., a smartphone or an electronic pad.

Figure 2:
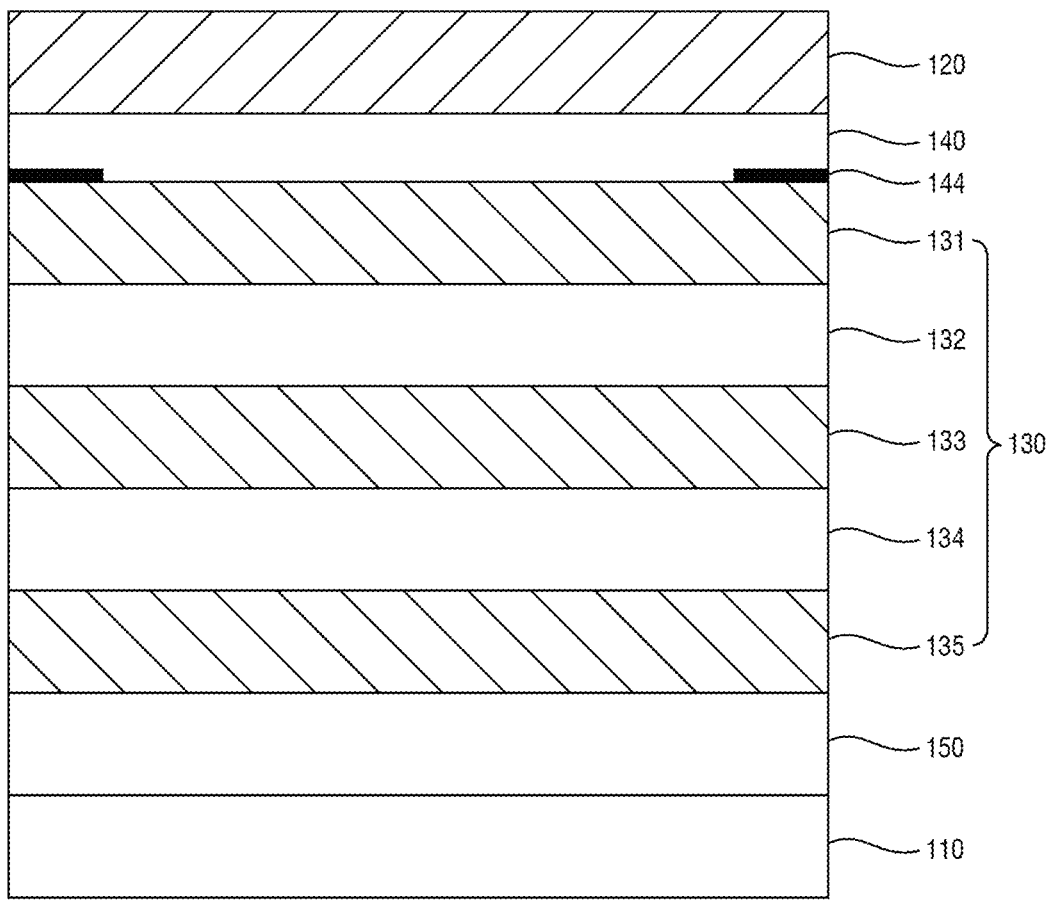
FIG. 2 is a reference view illustrating an adhesive layer shown in FIG. 1 in more detail.
Figure 3:
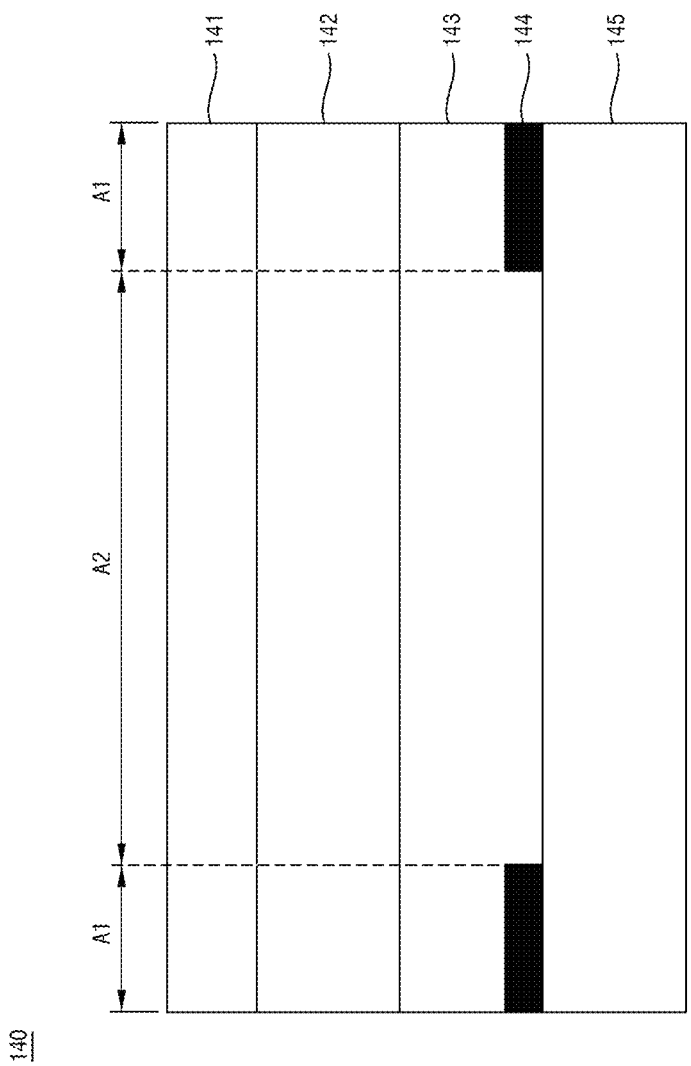
FIG. 3 is a partial cross-sectional view illustrating a barrier film shown in FIG. 1.

FIG. 1 is a cross-sectional view illustrating a display device according to one aspect of the present disclosure, FIG. 2 is a reference view illustrating an adhesive layer shown in FIG. 1 in more detail, and FIG. 3 is a partial cross-sectional view illustrating a barrier film shown in FIG. 1.

A display device 100 according to this aspect of the present disclosure may include a display panel 110, a cover window 120, an adhesive layer 130 and a barrier film 140. First, as the display panel 110, all types of display panels, such as a liquid crystal display panel, an electroluminescent display panel, etc., may be used. For example, as the electroluminescent display panel, an organic light emitting diode (OLED) display panel, a quantum-dot light emitting diode (QLED) display panel or an inorganic light emitting diode display panel may be used.

For example, when a liquid crystal display panel is used as the display panel 110, the display panel 110 includes a plurality of gate lines, a plurality of data lines, and pixels formed at intersections between the gate lines and the data lines. Further, the display panel 110 may include an array substrate including thin film transistors which are switching elements for respectively adjusting light transmittance in the pixels, an upper substrate having a color filter and/or a black matrix, and a liquid crystal layer formed between the array substrate and the upper substrate.

Alternatively, when an OLED display panel is used as the display panel 110, the display panel 110 includes a plurality of gate lines, a plurality of data lines, and pixels formed at intersections between the gate lines and the data lines.

Further, the display panel 110 may include an array substrate including thin film transistors which are elements for selectively applying voltage to the respective pixels, an organic light emitting diode (OLED) layer formed on the array substrate, and an encapsulation substrate arranged on the array substrate so as to cover the OLED layer. The encapsulation substrate may protect the thin film transistors and the OLED layer from external impacts and prevent moisture or oxygen from permeating the OLED layer.

A layer formed on the array substrate may include an inorganic light emitting layer, for example, a nano-sized material layer or quantum dots.

Hereinafter, an organic light emitting diode (OLED) display panel used as the display panel 110 will be exemplarily described. However, the display panel 110 is not limited thereto. For example, among electroluminescent display panels, a quantum-dot light emitting diode (QLED) display panel or an inorganic light emitting diode display panel may be used as the display panel 110.

The display panel 110 may include a display area which displays an image, and a non-display area which is located adjacent to the display area. For example, the display panel 110 may include a display area which displays an image, and a non-display area which is arranged to surround the display area.

The cover window 120 may be formed of a transparent material so as to transmit light emitted from the display panel 110. A cover glass, a cover plastic, etc. may be used as the cover window 120. Although this aspect of the present disclosure exemplarily describes the cover window 120 formed of plastic, a cover glass may be used as the cover window 120. More particularly, the cover window 120 may include polycarbonate (PC) or polymethyl methacrylate (PMMA).

Such a cover window 120 formed of transparent plastic is advantageous in that it is applicable to display devices which are bendable or foldable, such a flexible display device, a bendable display device, a rollable display device, etc.

The cover window 120 may be arranged on the display panel 110. Further, the barrier film 140 is arranged between the cover window 120 and the display panel 110. In addition, a touch film 134, as well as an optical film such as a light control film (LCF) 132, and a polarizing film 150 may be arranged between the barrier film 140 and the display panel 110.

The adhesive layer 130 includes a plurality of optically clear adhesive (OCA) layers. The adhesive layer 130 may include a first OCA layer 131, a second OCA layer 133 and a third OCA layer 135. The first OCA layer 131 may be arranged on the rear surface of the barrier film 140. Further, the second OCA layer 133 may be arranged on the rear surface of the LCF 132 located on the rear surface of the first OCA layer 131. The third OCA layer 135 may be arranged on the rear surface of the touch film 134 located on the rear surface of the second OCA layer 133. Further, the polarizing film 150 may be provided between the third OCA layer 135 and the display panel 110. Therefore, the first OCA layer 131 may be arranged between the barrier film 140 and the LCF 132, and the second OCA layer 133 may be arranged between the LCF 132 and the touch film 134. Further, the third OCA layer 135 may be arranged between the touch film 134 and the polarizing film 150. The adhesive layer 130 is configured such that objects to be coupled are adhered to both surfaces of each of the respective OCA layers 131, 133 and 135 formed of an optically clear adhesive having excellent optical transmittance.

Here, the LCF 132 may adjust an irradiation angle of light emitted towards the cover window 120 using a unit to block a portion of a transmission path of light, and adjust a viewing angle upwards and downwards or leftwards and rightwards to provide a function of preventing confusion caused by reflected light when the viewing angle is widened in an unnecessary direction.

Further, the polarizing film 150 may provide a function of adjusting the reflectance of light by absorbing a portion of light emitted from the display panel 110. That is, the polarizing film 150 may adjust the reflectance of light and thus adjust the intensity of light provided by the display panel 110, and the LCF 132 may adjust the irradiation angle of light and thus prevent reflection of light at an unnecessary viewing angle.

The barrier film 140 may include a bonding layer 141, a first coating layer 142, a black masking layer 143 and a second coating layer 145, as shown in FIG. 3.

The bonding layer 141 may adhere the barrier film 140 to the rear surface of the cover window 120, and the barrier film 140 according to the present disclosure may be integrally adhered to the cover window 120 during a process of forming the cover window 120 using an in-molding method. Therefore, during a process in which, while the first coating layer 142 of the barrier film 140 is firmly adhered to the rear surface of the cover window 120 through the bonding layer 141 at a high temperature, plastic of the cover window 120 is molded at a high temperature, gas is blocked by the barrier film 140 even if the gas is generated on the rear surface of the cover window 120. Accordingly, in the completed display device, since the gas is blocked by the barrier film 140, the gas may not affect the display panel, and thus defects caused by bubbles may be prevented.

The first coating layer 142 and the second coating layer 145 may be formed of polyethylene terephthalate (PET). Further, the black masking layer 143 may be formed by applying ink between the first coating layers 142 and the second coating layer 145. For example, the black masking layer 143 may be formed by printing an edge area with black ink and printing a central area except for the edge area with transparent ink. Of course, the material for the first and second coating layers 142 and 145 and the process for forming the black masking layer 143 are not limited thereto.

The first coating layer 142 and the second coating layer 145 serve to block the gas and maintain the strength of the barrier film 140, and the barrier film 140 may further include a plurality of coating layers, such as a third coating layer (not shown), depending on the desired level of strength of the barrier film 140. The strength of these coating layers 142 and 145 may be required to exhibit the function of a base film which needs to maintain the tension of the barrier film 140 applied when the barrier film 140 is unwound and wound in a roll-to-roll processing method and to maintain flatness during a process for forming the bonding layer 141 or the black masking layer 143.

The black masking layer 143 may have a black masking part 144 corresponding to the non-display area of the display panel 110. The black masking part 144 may provide a function of shielding a dummy part, such as dummy pixels, which is provided in a bezel area to be connected with the display panel 110, and wires which connect respective pixels. The black masking part 144 may be formed through printing, deposition or heat transfer using ink, and particularly, be formed through deposition, heat transfer or printing by forming a groove having a predetermined width on the black masking layer 143.

The black masking layer 143 may be divided into a first area A1 having the black masking part 144 located therein, a second area A2 excluding the first area A1. Here, the first area A1 and the second area A2 of the black masking layer 143 may have the same thickness. Of course, the black masking part 144 may be located at the center of the black masking layer 143 in the thickness direction thereof, or be arranged adjacent to the first coating layer 142. Therefore, in a structure in which a blacking masking layer is printed on the rear surface of a cover glass and an OCA layer is adhered thereto, there is a height difference (i.e., a stair part is formed) due to the height of the blacking masking layer located at only the edge of the rear surface of the cover glass, and bubbles are generated around the stair part during a process of adhering the OCA layer. However, in the present disclosure, the black masking layer 143 provided between the first OCA layer 131 and the cover window 120 may have the black masking part 144 while maintaining a uniform thickness, thereby preventing a height difference and thus being capable of omitting a bubble exhaustion process.

Figure 4:
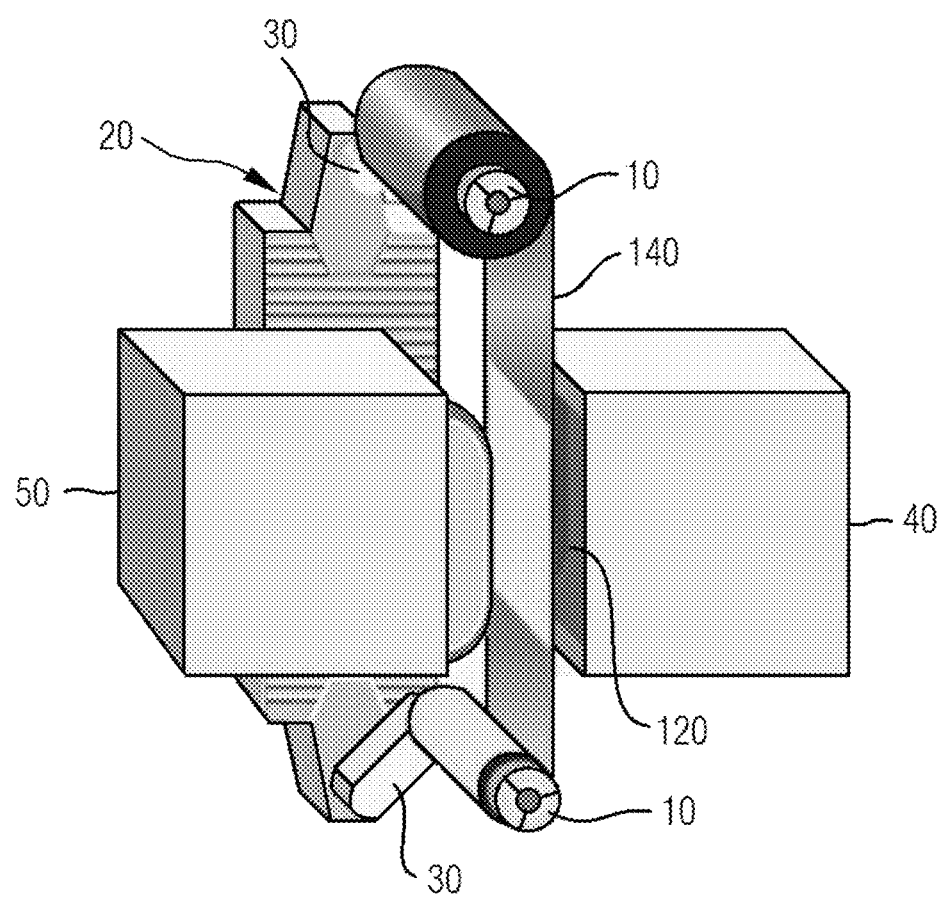
FIG. 4 is a perspective view illustrating an apparatus for manufacturing a cover window according to the present disclosure using an in-molding method.

FIG. 4 is a perspective view illustrating an apparatus for manufacturing the cover window according to the present disclosure using an in-molding method.

Referring to FIG. 4, the cover window 120 and the barrier film 140 according to the present disclosure are integrally coupled through the in-molding method. A manufacturing process using the in-molding method is described below.

First, the barrier film 140 may be wound on or unwound from rolls 10 disposed at both sides of the apparatus, and be continuously fed in a roll-to-roll manner. Here, the rolls 10 on which the barrier film 140 is wound are arranged on a film feeder 20 so as to be moved or rotated in directions in which the rolls 10 are spaced apart from each other so as to maintain the tension of the barrier film 140. For example, the rolls 10 may be fixed to ends of respective arms 30 of the film feeder 20, which are rotatable, and provide tension to the barrier film 140 in directions in which the rolls 10 are moved away from each other by rotary force of the arms 30.

Molds 40 and 50 for performing injection molding of the cover window 120 may be located on both sides of the central portion of the barrier film 140, the tension of which is maintained, between the two rolls 10. One mold 40 may be maintained in a fixed state, and the cover window 120 may be disposed on a surface of the mold 40 facing the barrier film 140. Further, the other mold 50 facing the mold 40 is disposed so as to be moved horizontally towards the barrier film 140. The mold 50 is moved towards the mold 40, and thus performs compression molding of the cover window 120 and simultaneously applies pressure to the barrier film 140 so as to adhere the barrier film 140 to the cover window 120. Of course, the cover window 120 may be disposed on the other mold 50, and the mold 50 may be moved towards the mold 40, which is fixed, so as to simultaneously perform both molding of the cover window 120 and adhesion of the barrier film 140 to the cover window 120. That is, the mold 50 is moved towards the mold 40 when the barrier film 140 is arranged between the molds 40, 50. And the plastic or resin forming the cover window is injected into a space between molds 40, 50. Then, cover window 120 and barrier film 140 are formed a whole.

When adhesion between one cover window 120 and the barrier film 140 has been completed, another cover window 120 newly supplied may be successively disposed on the mold 40, and the barrier film 140 may be fed in the roll-to-roll manner so as to continuously perform both molding of the cover window 120 and adhesion of the barrier film 140 to the cover window 120.

In the display device 100 according to the present disclosure, the barrier film 140 is adhered to the rear surface of the cover window 120 so as to prevent defects caused by bubbles, the barrier film 140 is integrally adhered to the cover window 120 during the process of forming the cover window 120 using the in-molding method so as to shorten a time taken to manufacture the display device 100, and the cover window 120 formed of plastic is used as a substituted for a cover glass so as to reduce manufacturing costs of the display device 100 and to shorten the time taken to manufacture the display device 100 compared to a display device including the cover glass.

As is apparent from the above description, a display device in accordance with the present disclosure has the following effects.

First, a barrier film is adhered to the rear surface of a cover window, so that even if the gas is generated on the rear surface of the cover window, since the gas is blocked by the barrier film, the gas may not affect the display panel, and thereby being capable of preventing defects caused by bubbles.

Second, a black masking layer is provided within the barrier film, thereby being capable of eliminating generation of a height difference caused by formation of a black printed layer on the rear surface of a cover glass.

Third, the barrier film is integrally adhered to the cover window during the process of forming the cover window using the in-molding method, thereby being capable of shortening a time taken to manufacture the display device.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:
1. A display device comprising:
a cover window;
a display panel arranged on a rear surface of the cover window;
a barrier film arranged between the display panel and the cover window; and
an optical film arranged between the barrier film and the display panel,
wherein the optical film includes a light control film configured to adjust an angle of light emitted from the display panel towards the cover window.

2. The display device according to claim 1, wherein the barrier film comprises:
a first coating layer arranged on the rear surface of the cover window;
a bonding layer configured to adhere the first coating layer to the cover window;
a black masking layer arranged on a rear surface of the first coating layer; and
a second coating layer arranged on a rear surface of the black masking layer.

3. The display device according to claim 2, wherein the black masking layer has a black masking part corresponding to a non-display area of the display panel.

4. The display device according to claim 3, wherein the black masking part is located at a first area and a second area has no black masking part, and the first and second areas have a same thickness.

5. The display device according to claim 2, wherein the first coating layer and the second coating layer include polyethylene terephthalate (PET).

6. The display device according to claim 1, wherein the cover widow includes at least one of polycarbonate (PC) and polymethyl methacrylate (PMMA).

7. The display device according to claim 1, wherein the barrier film is adhered to the cover window through an in-molding method when the cover window is formed.

8. The display device according to claim 1, further comprising a first adhesive layer adhered to a rear surface of the barrier film,
wherein the light control film is adhered to a rear surface of the first adhesive layer.

9. The display device according to claim 8, further comprising a second adhesive layer, a touch film and a third adhesive layer,
wherein the second adhesive layer is arranged on a rear surface of the light control film, the touch film is arranged on a rear surface of the second adhesive layer, and the third adhesive layer is arranged on a rear surface of the touch film.

10. The display device according to claim 9, wherein the optical film further includes a polarizing film interposed between the third adhesive layer and the display panel.

* * * * *